(12) United States Patent
Itoh et al.

(10) Patent No.: US 6,614,667 B1
(45) Date of Patent: Sep. 2, 2003

(54) METHOD AND APPARATUS FOR DRIVING SWITCHING ELEMENT IN POWER CONVERTER

(75) Inventors: Kazuyuki Itoh, Tokyo (JP); Yoshihisa Okita, Tokyo (JP); Katsuaki Tanaka, Tokyo (JP); Yoshinobu Takayanagi, Tokyo (JP)

(73) Assignee: TDK Corporation, Tokyo (JP)

( * ) Notice: Subject to any disclaimer, the term of this patent is extended or adjusted under 35 U.S.C. 154(b) by 142 days.

(21) Appl. No.: 09/830,102

(22) Filed: Apr. 23, 2001

Related U.S. Application Data (63) Continuation of application No. PCT/JP00/06779, filed on Sep. 29, 2000.

(30) Foreign Application Priority Data

Oct. 7, 1999 (JP) .......................................... 11-287250

(51) Int. Cl.[7] ............................................ H02M 3/335
(52) U.S. Cl. ................................ 363/21.01; 363/21.17; 363/19
(58) Field of Search ..................... 363/19, 21.02–21.18, 363/97, 131

(56) References Cited

U.S. PATENT DOCUMENTS

| | | | |
|---|---|---|---|
| 5,901,051 A | 5/1999 | Takahashi et al. | ........ 363/21.18 |
| 6,134,123 A | 10/2000 | Yamada | ................. 363/21.13 |
| 6,445,598 B1 | 9/2002 | Yamada | ................. 363/21.12 |

FOREIGN PATENT DOCUMENTS

| JP | 47-31531 | 8/1972 |
|---|---|---|
| JP | 7-264029 | 10/1995 |

OTHER PUBLICATIONS

"Development of a High Efficiency Inverter without Audible Noise", Takahashi, et al., T.IEE Japan, vol. 116–D, No. 12, 1996, pp. 1205–1210.
"How to Get 99% Inverter Efficiency", Takahashi, et al., 0–7803–1993–1/94 IEEE 1994, pp. 971–976.
"Silent High Efficiency Inverter", ITOH et al., (1995).

*Primary Examiner*—Jessica Han
(74) *Attorney, Agent, or Firm*—Cohen, Pontani, Lieberman & Pavane (57) ABSTRACT

A power conversion apparatus capable of reducing the conduction loss to achieve high efficiency yielding a downsized and weight-reduced apparatus and a method for driving such a power conversion apparatus is disclosed. A power conversion apparatus comprising a switching-element driving circuit which includes a current transformer having a primary coil connected to an current control type switching element, and a driving-current generating circuit formed of a secondary coil of the current transformer and a rectifying circuit connected to the secondary coil, wherein an output current generated in the driving-current generating circuit is supplied to the switching element as a driving current of the switching element, and a method for driving the switching element of such a power conversion apparatus are disclosed. This method comprises the steps of detecting an output current of the switching element, and extracting a part of the output current of the driving-current generating circuit out of the switching-element driving circuit so as to variably controlling the driving current of the switching element in response to the output current of the switching element. Preferably, the output current of the driving-current generating circuit extracted out of the switching-element driving circuit is supplied to any other auxiliary power supply as a regenerative power.

10 Claims, 9 Drawing Sheets

METHOD AND APPARATUS FOR DRIVING SWITCHING ELEMENT IN POWER CONVERTER

This application is a Continuation patent application of International Application PCT/JP00/06779 (not published in English), filed on Sep. 29, 2000.

TECHNICAL FIELD

The present invention relates to a switching circuit in a switching-type power conversion apparatus and a method for driving the switching circuit. In particular, the present invention relates to a power conversion apparatus including a switching circuit in which a current control type semiconductor switching element is supplied with a driving power for switching the semiconductor switching element in response to a control signal and a current transformer serving as an auxiliary power supply is connected to the switching element, and to a method for driving the power conversion apparatus.

BACKGROUND ART

In view of the efficient utilization of energy, power conversion apparatuses applying a semiconductor switching element are used in significantly wide area due to their excellent property in power conversion efficiency. In the field of such power conversion apparatuses, various approaches have been made to enhance the efficiency. For instance, in the Transactions of the Institute of Electrical Engineers of Japan, vol. 116-D, No. 12, pp. 1205–1210 (1996), it is proposed that a transistor having a small conduction loss is employed as a switching element of a switching circuit, this sort of two transistors being connected to form a Darlington connection wherein the primary one of the two transistor is used as a driving transistor, and a current transformer serving as an auxiliary power supply being interposed between the driving transistor and the switching transistor. This paper reports that the above circuitry may reduce the conduction loss to about one-third as compared to that of conventional switching elements.

According to the circuit described in this paper, a voltage drop in an ON-state of the switching element becomes equal to a saturation voltage of the switching element by virtue of to the auxiliary power supply so that the switching element may be operated with lower voltage drop than that in an ON-state of transistors connected to form an ordinary Darlington-connection, and may provide an improved efficiency. In this case, the current transformer acts to vary a current supplied from the auxiliary power supply in response to an output current of the switching element.

In this conventional circuit, since a driving current of the switching element is defined by a coil ratio of the current transformer, it is necessary for the current transformer to be designed based on a minimum current amplification factor of the switching element. Thus, the switching element can be undesirably driven to run into an oversaturation state during light-load condition, and thereby it is difficult to achieve an optimized conduction loss.

DISCLOSURE OF INVENTION

The present invention has been embodied to solve the problem of the aforementioned circuit suggested in the Transactions of the Institute of Electrical Engineers of Japan described above. Thus, it is an object of the present invention to provide a power conversion apparatus capable of reducing the conduction loss to achieve high efficiency yielding a downsized and weight-reduced apparatus and a method for driving such a power conversion apparatus.

In order to achieve the object, the present invention provides a method for driving a switching element in a power conversion apparatus comprising a switching-element driving circuit which includes a current transformer having a primary coil connected to an current control type switching element, and a driving-current generating circuit formed of a secondary coil of the current transformer and a rectifying circuit connected to the secondary coil, wherein an output current generated in the driving-current generating circuit is supplied to the switching element as a driving current of the switching element. This method comprises the steps of detecting an output current of the switching element, and extracting a part of the output current of the driving-current generating circuit out of the switching-element driving circuit so as to variably controlling the driving current of the switching element in response to the output current of the switching element. Preferably, the output current of the driving-current generating circuit extracted out of the switching-element driving circuit is supplied to any other auxiliary power supply as a regenerative power.

In a preferred embodiment of the present invention, a specific value of the output current extracted out of the switching-element driving circuit is determined to substantially achieve an optimum driving current value for minimizing an overall conduction loss considering the conduction loss of the switching element and the driving power necessary for driving the switching element. The driving current of the switching element is preferably variably controlled in response to the temperature of the switching element.

In another aspect, the present invention provides a power conversion apparatus. This power conversion apparatus includes an current control type switching element, a current transformer having a primary coil connected in series with the switching element and a secondary coil, a driving-current generating-circuit formed of the secondary coil of the current transformer and a rectifying circuit connected to the secondary coil, and a switching-element driving circuit supplying an output current generated in the driving-current generating circuit to the switching element as a driving current of the switching element. As features of the present invention, the power conversion apparatus further comprises an output current detecting device for detecting an output current of the switching element, a control device for forming a control signal to variably control the driving current of the switching element in response to a value of the output current of the switching element detected by the output current detecting device, and a current extracting circuit operated in response to the control signal to extract a current having a specific value corresponding to the control signal from the output current in the driving-current generating circuit out of the switching-element driving circuit. Preferably, the current extracting circuit is configured to be a generative circuit for supplying the current extracted out of the switching-element driving circuit to any other auxiliary power supply as a regenerative current. More preferably, this regenerative circuit is adapted to perform power regeneration through a switching operation.

The power conversion apparatus according to the present invention is adapted to detect the output current of the switching element and extract a part of the output current of the driving-current generating circuit out of the switching-element driving circuit so as to variably controlling the driving current of the switching element in response to the output current of the switching element. Thus, the optimum driving current may be supplied to the switching element in response to the output current of the switching element so that the conduction loss of the switching element may be minimized. For example, the driving current of the switching element may be optimized by determining the output current value extracted out of the switching-element driving circuit so as to substantially achieve the optimum driving current value for minimizing the overall conduction loss considering the conduction loss of the switching element and the driving power necessary for driving the switching element.

BEST MODE FOR CARRYING OUT THE INVENTION

Figure 1:
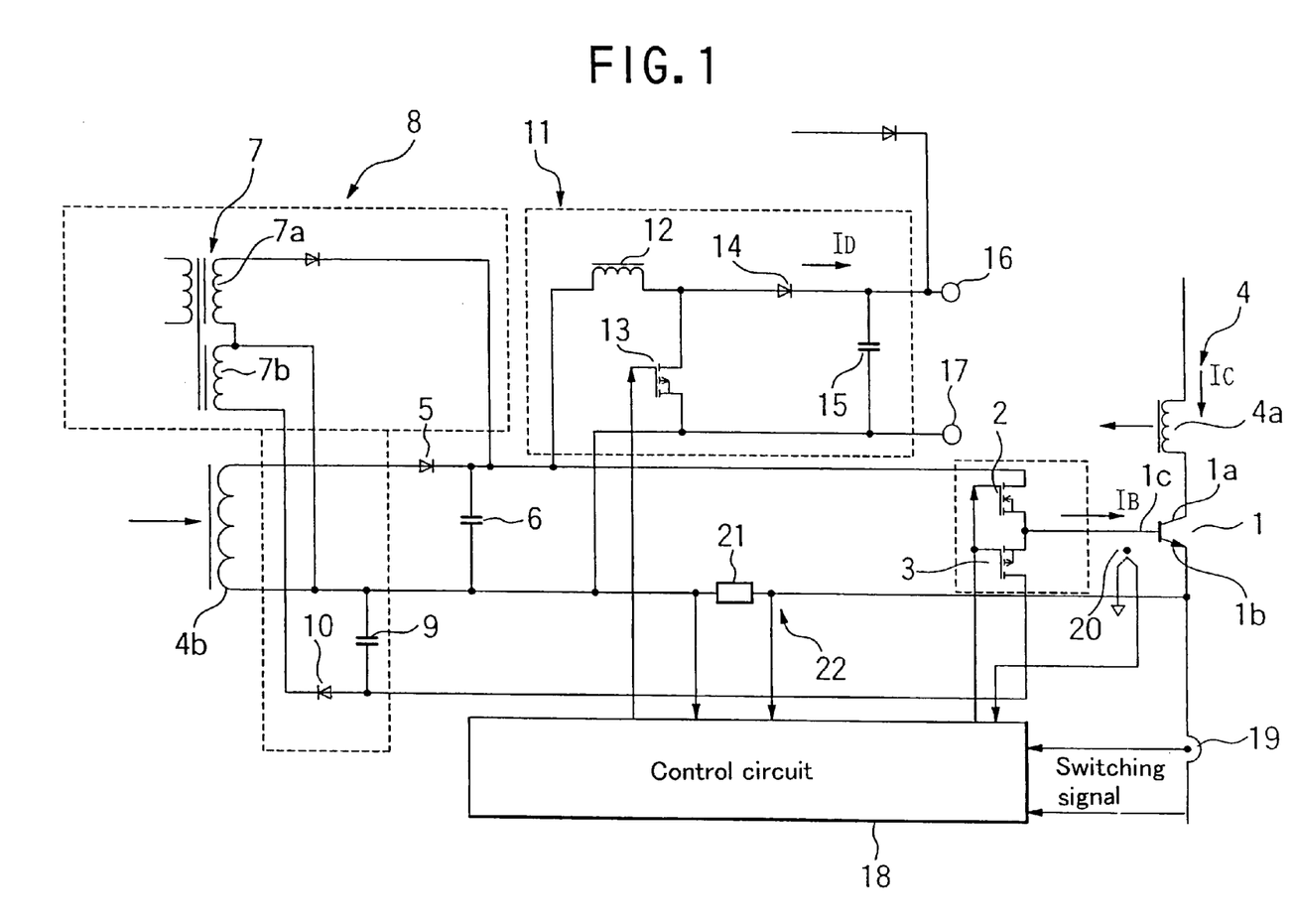
FIG. 1 is a circuit diagram showing a switching circuit of a power conversion apparatus according to one embodiment of the present invention.

With reference to the drawings, embodiments of the present invention will now be described. FIG. 1 shows a switching circuitry of a power conversion apparatus according to one embodiment of the present invention. This switching circuit is provided with a current control type transistor 1 as a semiconductor switching element having a collector 1a, an emitter 1b, and a base 1c. An output current of the switching circuit flows through the transistor 1 from the collector 1 a to the emitter 1b.

The driving circuit supplying a driving current to the switching element includes two semiconductor switches 2 and 3 connected in series with each other, and a connection point of the semiconductor switches 2 and 3 is connected to the base 1c of the transistor 1. A current transformer 4 having a primary coil 4a and a secondary coil 4b is provided as a driving-current generating circuit for generating the driving current of the transistor 1. The primary coil of the current transformer 4 is connected to the collector 1a of the transistor 1. Both ends of the secondary coil 4b of the current transformer 4 are connected to a rectifying circuit composed of a diode 5 and a capacitor 6. Further, the one and another ends of the secondary coil 4b of the current transformer 4 are connected to the semiconductor switch 2 and the emitter 1b of the transistor 1, respectively. Thus, in an ON-state of the semiconductor switch 2, an current proportional to an output current IC of the transistor 1 is generated in the secondary coil 4b, and thereby the current proportional to the output current IC flows into the base 1c of the transistor 1.

This switching circuit is additionally provided with an activation circuit 8 having an auxiliary power supply transformer 7. The auxiliary power supply transformer 7 includes first and second secondary coils 7a and 7b connected in series with each other. Both ends of the first secondary coil 7a are connected to the both ends of the secondary coil 4b of the current transformer 4, respectively. Both ends of the second secondary coil 7b are connected to a rectifying circuit composed of a capacitor 9 and a diode 10. The second secondary coil 7b forms a part of a reverse bias circuit for the transistor 1. One and another ends of the second secondary coil 7b are connected to the emitter 1b of the transistor 1 and the semiconductor switch 3, respectively.

As one feature of the present invention, this switching circuit is provided with a regenerative circuit 11 for extracting a part of the current generated in the secondary coil 4b of the current transformer 4. The regenerative circuit 11 includes a semiconductor switch 13 connected to both ends of the secondary coil 4b of the current transformer 4 through an inductor 12. The semiconductor switch 13 is connected to regenerative output terminals 16 and 17 through a rectifying circuit composed of a rectifying element 14 and a capacitor 15. The regenerative output terminals 16 and 17, for example, are connected to any suitable auxiliary power supply or the like so as to supply the power extracted from the regenerative circuit to any other circuit in response to the switching operation of the semiconductor switch 13.

This switching circuit is further provided with a control circuit 18 for controlling each operation of the semiconductor switches 2, 3 and the semiconductor switch 13. Several detecting devices are provided for sending signals necessary for the control circuit 18. These detecting device include an output current detecting device 19 for detecting the output current IC from the transistor 1 and a temperature detecting device 20 for detecting the temperature of the transistor 1, and each detected signals of the detecting devices is inputted into the control circuit 18. A resistor 21 is interposed in a line connecting between the secondary coil 4b of the current transformer 4 and the emitter 1b of the transistor 1. A base current detecting device 22 is provided for detecting each voltage at both ends of the resistor 21 to detect a base current of the transistor 1 and then supplying a base current signal to the control circuit 18.

In order to bring the transistor 1 into an ON state, the semiconductor switch 2 is turned on and the semiconductor switch 3 is turned off. The base current IB is supplied from the secondary coil 4b of the current transformer 4 to the base 1c of the transistor 1 so as to maintain the transistor 1 in the ON state. The current detecting device 19 detects a collector current as the output current of the transistor 1 to send the detected signal to the control circuit 18. At the same time, the temperature of the transistor 1 is detected by the temperature detecting device 20, and the base current of the transistor 1 is detected by the base current detecting device 20. Each detected signal is sent to the control circuit 18.

The current generated in the secondary coil 4b of the current transformer 4 has a value determined by a coil ratio of the current transformer 4 and the output current of the transistor 1, i.e. the collector current IC. The control circuit 18 outputs a switching signal to switch the semiconductor switch 2 in response to the switching signal input into the semiconductor switch 2.

Figure 2:
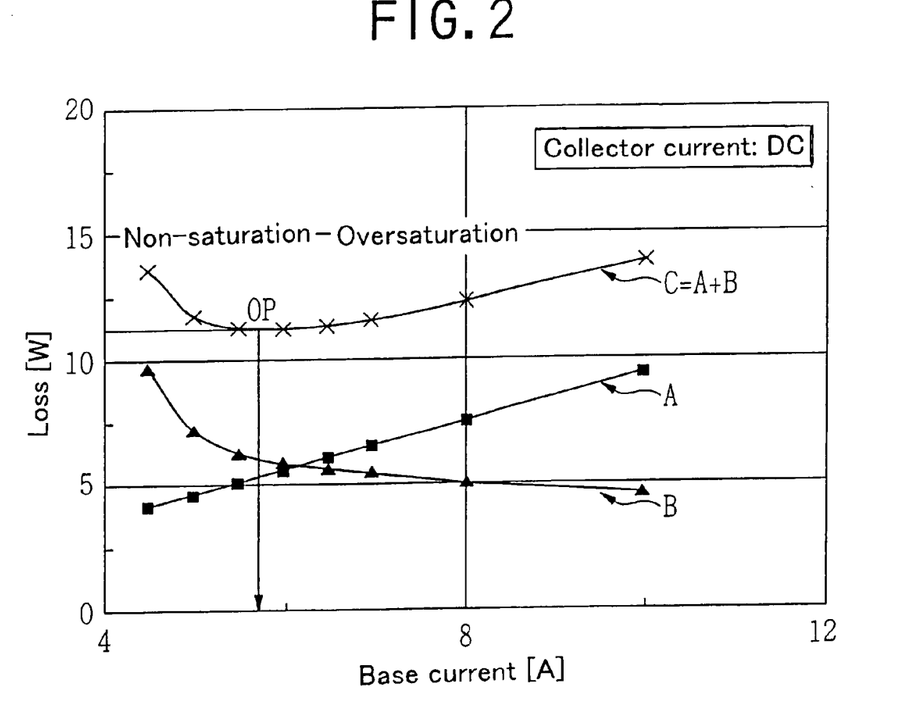
FIG. 2 is a diagram showing the relationship between a base current and a conduction loss/driving power in a transistor.
Figure 3:
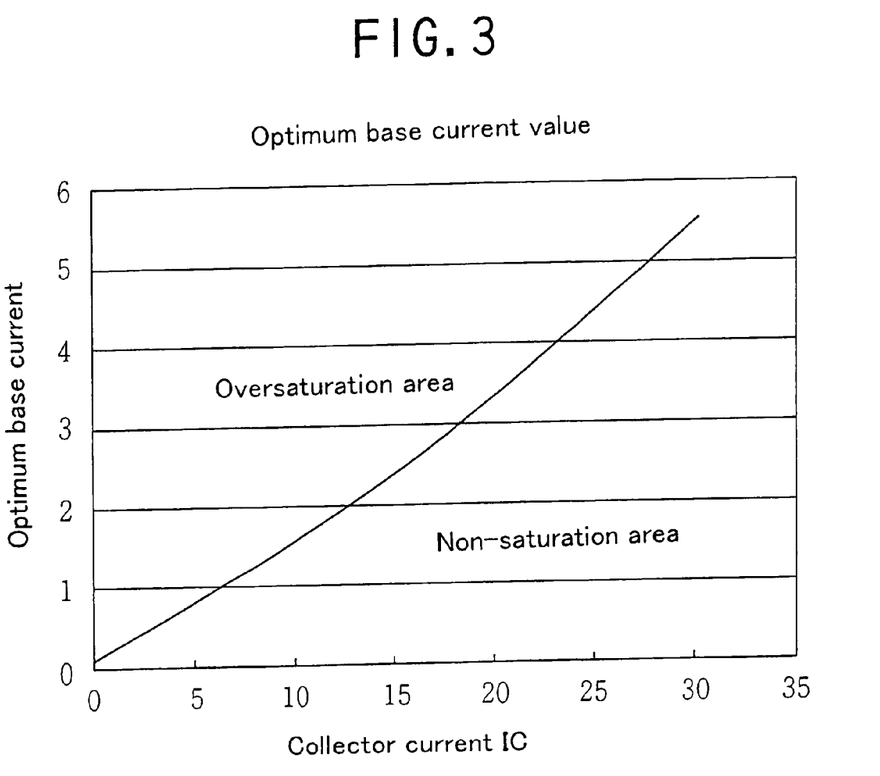
FIG. 3 is a diagram showing the relationship between a collector current and an optimum base current in a transistor.
Figure 4:
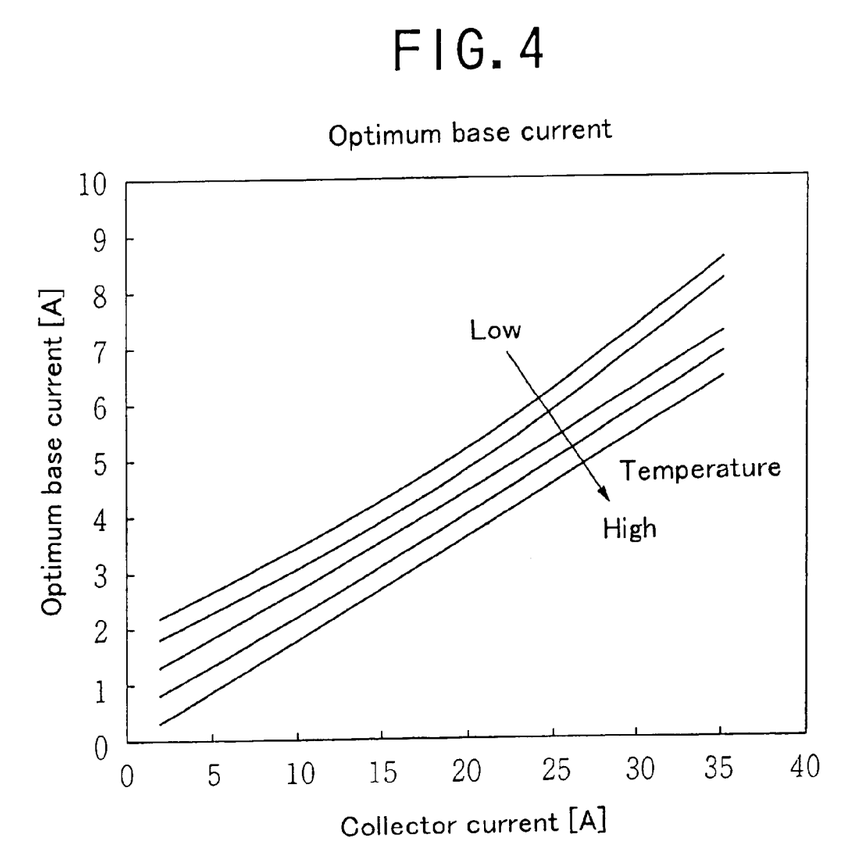
FIG. 4 is a diagram showing curves similar to the curve shown in FIG. 3 at various temperatures of the transistor.

With reference to FIG. 2, in the case when the transistor is in the ON state, the collector current being constant, and the base current being varied, the curve A and curve B show a driving power of the transistor and a conduction loss between the collector and the emitter, respectively. The curve C shows an overall loss derived by summing the loss A and loss B. As seen from this diagram, under the constant collector current, the overall loss C becomes minimum when the value of the base current is OP. FIG. 3 is a diagram showing a result of an optimum base current value for each collector current, which has been determined by carrying out the same measurement as that in FIG. 2 with varying the collector current. FIG. 4 shows a result determined by taking curves similar to the curve shown in FIG. 3 at various temperatures of the transistor.

The control circuit 18 stores the data shown in FIG. 4 in advance and calculates the optimum base current values in response to the input signal. Then, the control circuit 18 generates a control signal to control the switching operation of the semiconductor switch 13 of the regenerative circuit 11 based on the detected value of the base current detecting device 22 so as to obtain the optimum base current. Through this control, a specific current exceeding the optimum base current value among the currents generated in the secondary coil 4b of the current transformer 4 is extracted from the regenerative circuit 11 as a regenerative current ID.

Figure 5:
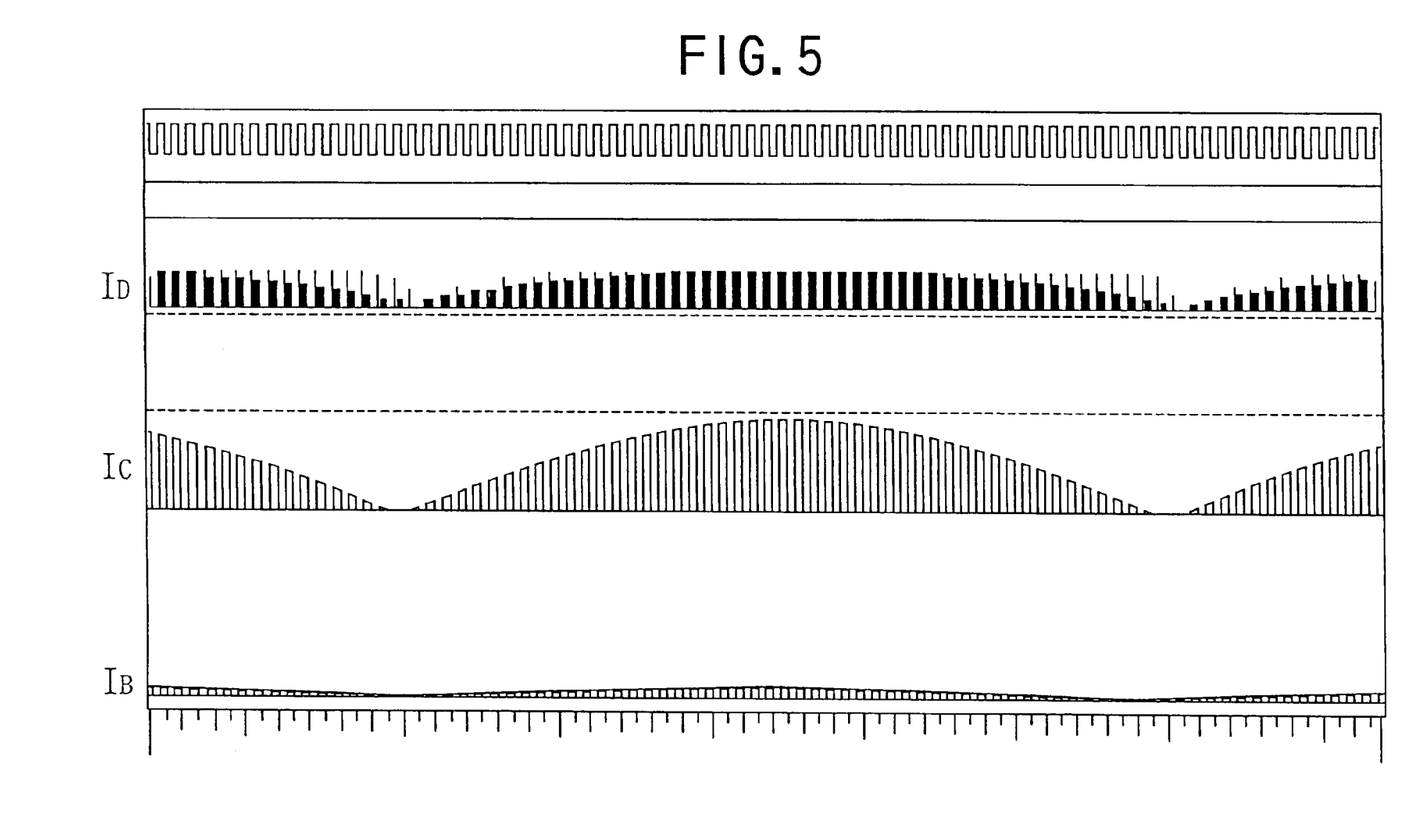
FIG. 5 is a waveform chart showing a collector current, a base current, and a regenerative current in the switching circuit of FIG. 1.

FIG. 5 is a waveform chart showing a current at each portion in the switching circuit of FIG. 1. The optimum base current IB is varied in response to the variation of the collector current IC of the transistor 1, and the excessive current is extracted as the regenerative current ID. Thus, the optimum base current is supplied to the transistor 1 in response to said collector current so that the overall loss of the transistor 1 may be minimized in the ON state of the transistor 1.

In order to an OFF state of the transistor 1, the semiconductor switch 3 is turned on and the semiconductor switch 2 is turned off. In this state, a reverse bias is applied to the base of the transistor 1 to eliminate an accumulated charge in the transistor 1 in a short time, and thereby the transistor 1 may be turned off at high speed. Thus, a noise margin in the OFF state of the transistor 1 may be increased.

When the transistor 1 will be activated from the OFF state to the ON state, the semiconductor switch 2 is brought into the ON state, and the capacitor 6 is initially charged by the activating auxiliary power supply 8. When the capacitor 6 has been charged, the base current flows through the transistor 1 to bring the transistor 1 into the ON state. Then, the current corresponding to the output current of the transistor 1 is supplied to the base 1c of the transistor 1 through the semiconductor switch 2 by the current transformer 4.

Figure 6:
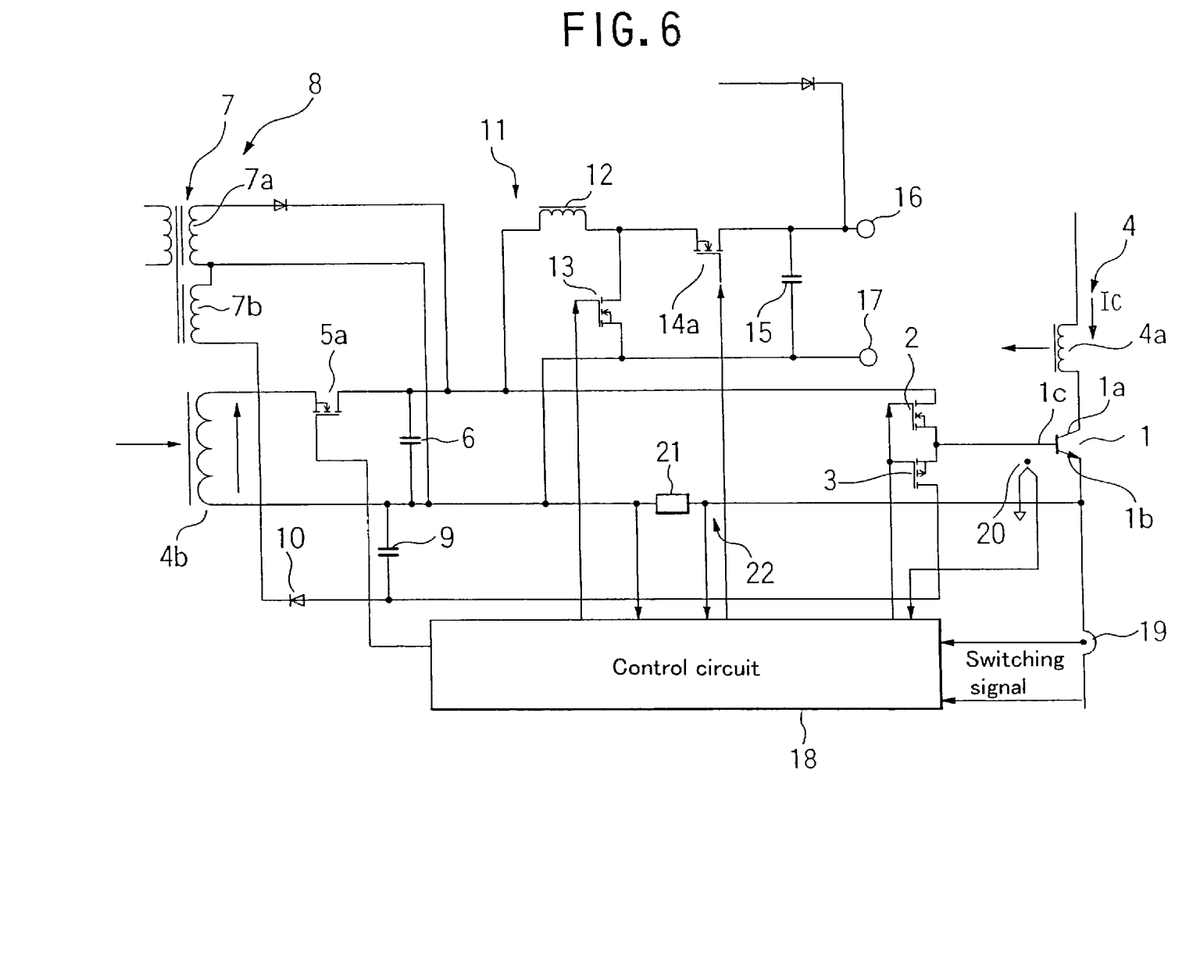
FIG. 6 is a circuit diagram showing a switching circuit according to another embodiment of the present invention.

FIG. 6 shows another embodiment of the present invention. The circuit of this embodiment is applied with field-effect transistors (FET) 5a and 14a as a substitute for the diodes 5 and 14 in the circuit in FIG. 1, respectively, and serves as a synchronous commutator type circuit in which these transistors are switched in sync with each operation of the semiconductor switches 2 and 13.

Figure 7:
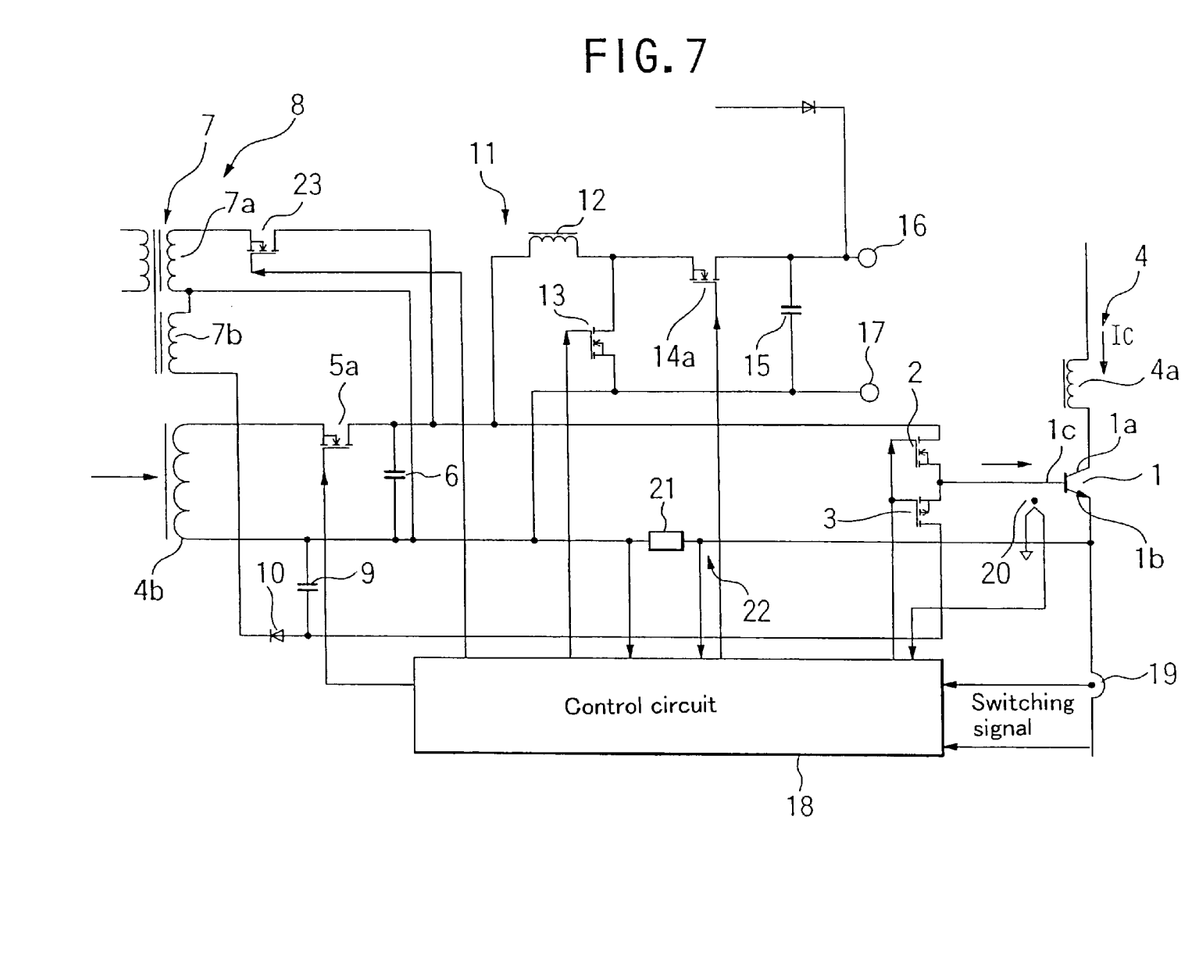
FIG. 7 is a circuit diagram showing a switching circuit according to still another embodiment of the present invention.

FIG. 7 shows a modification of the embodiment of FIG. 6. In this example, another synchronous commutator circuitry is provided by interposing a field-effect transistor 23 in a line connecting between the first secondary coil 7a of the auxiliary power supply transformer 7 of the activating auxiliary power supply 8 and the secondary coil 4b of the current transformer 4.

Figure 8:
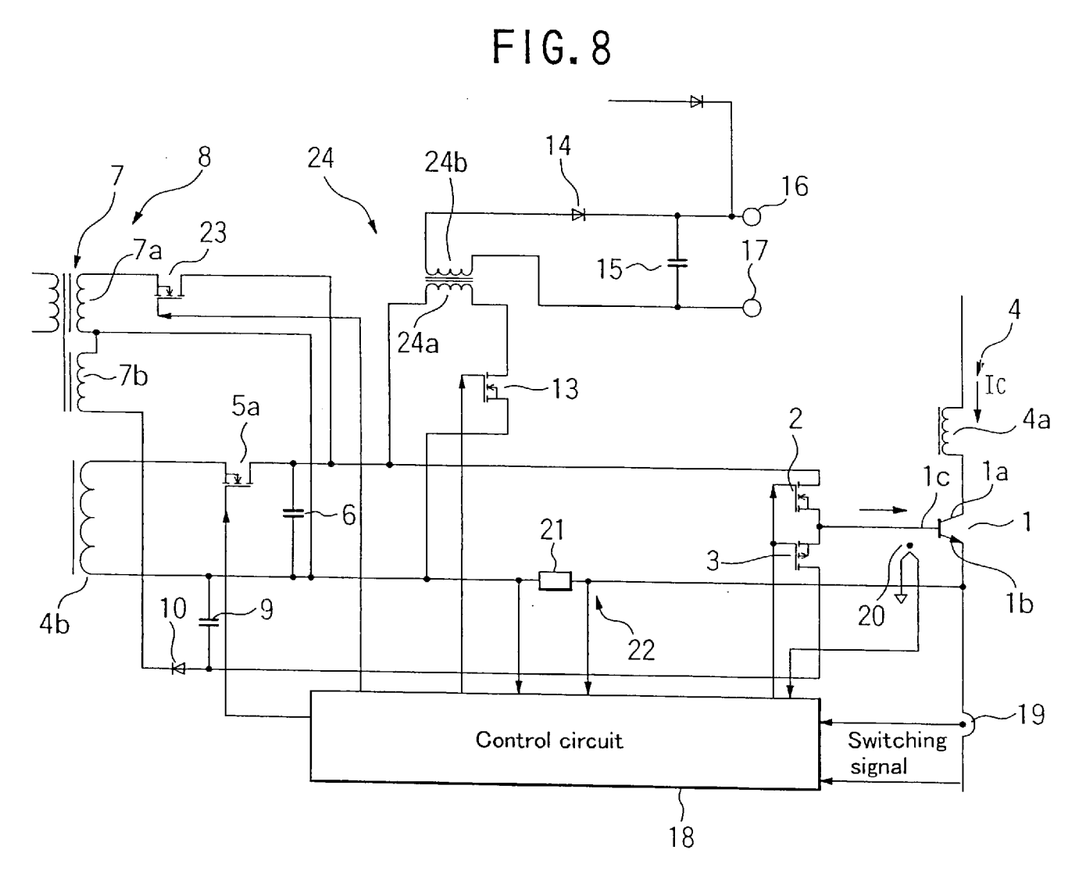
FIG. 8 is a circuit diagram showing a switching circuit according to yet another embodiment of the present invention.

FIG. 8 shows still another embodiment of the present invention. The circuit of this embodiment is provided with a flyback converter in which the regenerative circuit comprises a transformer 24 having coils 24a and 24b, a diode 14, and a condenser 15 in addition to the semiconductor switch 13. Other construction is same as that in the circuit of FIG. 7.

Figure 9:
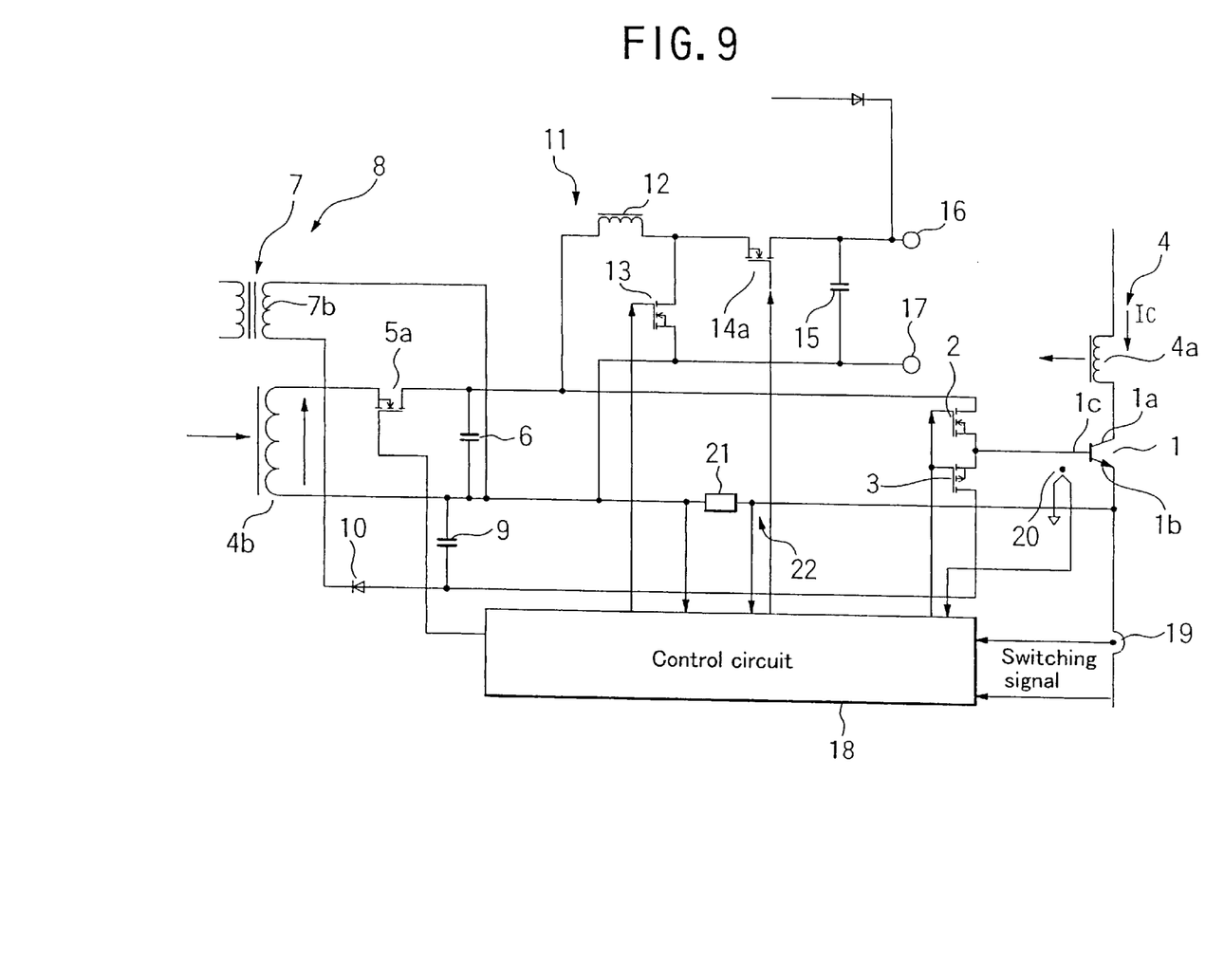
FIG. 9 is a circuit diagram showing a switching circuit according to still a further embodiment of the present invention.

FIG. 9 shows yet another modification of the embodiment of FIG. 6. In this example, the activating coil 7a in the circuit of FIG. 6 is omitted. This circuit is adapted to supply an activation power without the activating coil 7a by turning the semiconductor switch 14a on in the activating operation of the transistor. After the activation, the semiconductor switch 14a functions to form the regenerative circuit. This operation is same as that of the semiconductor switch 14a in the circuits of FIGS. 6 and 7.

We claim:

1. A method for driving a switching element in a power conversion apparatus comprising a switching-element driving circuit which includes a current transformer having a primary coil connected to a current control type switching element, and a driving-current generating circuit formed of a secondary coil of said current transformer and a rectifying circuit connected to said secondary coil, wherein an output current generated in said driving-current generating circuit is supplied to said switching element as a driving current of said switching element, said method comprises the steps of;

detecting an output current of said switching element, and
extracting a part of said output current of said driving-current generating circuit out of said switching-element driving circuit so as to variably controlling said driving current of said switching element in response to said output current of said switching element.

2. A method for driving a switching element as defined in claim 1, wherein said output current of said driving-current generating circuit extracted out of said switching-element driving circuit is supplied to any other auxiliary power supply as a regenerative power.

3. A method for driving a switching element as defined in claim 2, wherein said output current extracted out of the switching-element driving circuit is determined in a specific value to substantially achieve an optimum driving current value for minimizing an overall conduction loss considering a conduction loss of said switching element and a driving power necessary for driving said switching element.

4. A method for driving a switching element as defined in claim 2, wherein said driving current of said switching element is variably controlled in response to a temperature of said switching element.

5. A method for driving a switching element as defined in claim 1, wherein said output current extracted out of the switching-element driving circuit is determined in a specific value to substantially achieve an optimum driving current value for minimizing an overall conduction loss considering a conduction loss of said switching element and a driving power necessary for driving said switching element.

6. A method for driving a switching element as defined in 5, wherein said driving current of said switching element is variably controlled in response to a temperature of said switching element.

7. A method for driving a switching element as defined in claim 1, wherein said driving current of said switching element is variably controlled in response to a temperature of said switching element.

8. A power conversion apparatus comprising:
an current control type switching element;
a current transformer having a primary coil and a secondary coil, said primary coil connected in series with said the switching element;

a driving-current generating circuit formed of said secondary coil of said current transformer and a rectifying circuit connected to said secondary coil;

a switching-element driving circuit supplying an output current generated in said driving-current generating circuit to said switching element as a driving current of said switching element;

an output current detecting device for detecting an output current of said switching element;

a control device for forming a control signal to variably control said driving current of said switching element in response to a value of said output current of said switching element detected by said output current detecting device; and a current extracting circuit operated in response to said control signal to extract a current having a specific value corresponding to said control signal from said output current in said driving-current generating circuit out of said switching-element driving circuit.

9. A power conversion apparatus as defined in claim 8, wherein said current extracting circuit is a generative circuit for supplying said current extracted out of said switching-element driving circuit to any other auxiliary power supply as a regenerative current.

10. A power conversion apparatus as defined in claim 9, wherein said regenerative circuit is adapted to perform power regeneration through a switching operation.

* * * * *